US005216210A

United States Patent [19]

Kammer

[11] Patent Number: 5,216,210

[45] Date of Patent: Jun. 1, 1993

[54] LOUDSPEAKER SYSTEM WITH PASSIVE SOUND REFLECTIVE INTENSIFIER

[76] Inventor: Brent T. Kammer, 2654 McGregor Dr. #20, Rancho Cordova, Calif. 95670

[21] Appl. No.: 842,478

[22] Filed: Feb. 27, 1992

[51] Int. Cl.[5] ............................................ H05K 5/00

[52] U.S. Cl. .................................. 181/144; 181/148; 181/155; 181/156

[58] Field of Search ............... 181/155, 156, 148, 151, 181/199, 144; 381/89, 90, 159, 160

[56] References Cited

U.S. PATENT DOCUMENTS

| | | | |
|---|---|---|---|
| 3,780,824 | 12/1973 | Prince | 181/156 |
| 4,064,966 | 12/1977 | Burton | 181/155 X |
| 4,139,075 | 2/1979 | Kobayashi et al. | 181/199 |
| 4,301,332 | 11/1981 | Dusanek | 181/156 |
| 4,733,749 | 3/1988 | Newman et al. | 181/199 X |
| 4,924,962 | 5/1990 | Terai et al. | 181/155 X |
| 4,939,703 | 7/1990 | Muller | 181/155 X |
| 4,984,653 | 1/1991 | Spors | 181/199 X |

*Primary Examiner*—Michael L. Gellner
*Assistant Examiner*—Khanh Dang
*Attorney, Agent, or Firm*—Thomas R. Lampe

[57] ABSTRACT

A loudspeaker system including a cabinet and at least one loudspeaker mounted on the cabinet which includes a movable speaker element for directing acoustical wave energy to the ambient atmosphere and to the interior of the cabinet. A passive radiator is mounted on the cabinet at a location spaced from the loudspeaker. A panel mounted within the cabinet interior vibrates at a free end when impacted by the acoustical wave energy from the loudspeaker. The panel generates acoustical wave energy which is directed to the passive radiator and causes the passive radiator to move and to direct sound externally of the cabinet.

13 Claims, 2 Drawing Sheets

LOUDSPEAKER SYSTEM WITH PASSIVE SOUND REFLECTIVE INTENSIFIER

TECHNICAL FIELD

This invention relates to the field of sound reproduction. More particularly, the invention relates to a loudspeaker system which enhances the quality of sound directed to the listener. The system has special application to the reproduction of lower pitched acoustic waves, such as those produced by a bass speaker, at lower levels of amplification while avoiding sound distortion.

BACKGROUND ART

Prior art conventional loudspeaker systems are generally characterized by their inability to accurately and effectively reproduce bass sounds at lower levels of amplification. Not only is there a quantitative diminishment of bass at lower levels of amplification, there is a qualitative drop-off as well. Tonal modification and distortion take place due at least in part to the fact that bass components present in virtually every tonal pitch will be either eliminated before reaching the listener or seriously attenuated. Not only is the overall quality of the sound impaired, the listener can suffer what is known as "ear bite," with attendant sub-conscious agitation (occasionally manifested by headaches) due to the diminished tapering tones or harshness caused by a drop-off of bass efficiency at lower volume levels.

Many amplifiers incorporate circuitry which attempts to correct by electronic means the aforesaid difficulties. Such an approach is unsatisfactory in that while there will be an apparent increase in the bass of the reproduced sound at lower volumes, the quality thereof is not reattained.

There are, of course, loudspeaker system constructions which utilize a number of techniques to enhance bass. A search of the prior art located the following United States patents which disclose loudspeakers and loudspeaker systems which can be considered representative of the prior art: U.S. Pat. No. 4,924,962, issued May 15, 1990, U.S. Pat. No. 4,939,703, issued Jul. 3, 1990, U.S. Pat. No. 4,733,749, issued Mar. 29, 1988, U.S. Pat. No. 4,984,653, issued Jan. 15, 1991, and U.S. Pat. No. 4,064,966, issued Dec. 27, 1977. The arrangements disclosed in these patents do not address or solve the problems outlined above.

DISCLOSURE OF INVENTION

The present invention relates to both an apparatus and a method for accurately reproducing bass sound even at low levels of amplification. Reproduction is accomplished by the loudspeaker system itself and without the need for supplemental electronic bass enhancement.

The apparatus includes a cabinet having interconnecting walls defining an interior. At least one loudspeaker is mounted on the cabinet and includes a movable speaker element for directing acoustical wave energy to the ambient atmosphere and also to the cabinet interior.

Passive radiator means is mounted on the cabinet at a location spaced from said at least one loudspeaker.

Acoustic energy transfer means is disposed within the cabinet housing and positioned relative to the at least one loudspeaker for impact by acoustical wave energy directed to the cabinet interior by the movable speaker element. The acoustic energy transfer means moves in response to the impact and is operable to direct acoustical wave energy to the passive radiator means to move the passive radiator means.

The acoustic energy transfer means comprises an elongated member having a substantially planar surface impacted by acoustical wave energy from the movable speaker element. The elongated member vibrates or flaps under the impact of acoustical wave energy from the movable speaker element and has a free distal end vibrating or flapping at an amplitude exceeding the amplitude of vibration of the remainder of the elongated member.

The passive radiator means is in at least partial registration with a portion of the elongated member adjacent to the free distal end whereby acoustical wave energy is directed to the passive radiator means by the elongated member portion.

The elongated member comprises a panel having a plurality of panel segments. The panel segments are relatively movable and have free ends for vibrating at independent rates of vibration responsive to impact of acoustical wave energy from the movable speaker element.

The method of the present invention is for the purpose of enhancing the sound characteristics of a speaker system including a cabinet defining an interior and a loudspeaker mounted on the cabinet.

The method includes the step of positioning a passive radiator in a cabinet opening spaced from the loudspeaker.

An elongated member having opposed ends and a substantially planar surface is positioned within the cabinet interior with the substantially planar surface spaced from the loudspeaker and the passive radiator.

The elongated member is supported at one of the ends thereof while the other end thereof is maintained unsupported and at a position adjacent to the passive radiator.

The elongated member is impacted with acoustical wave energy from the loudspeaker to vibrate the elongated member at the unsupported end.

The vibrating, unsupported end is employed to generate acoustical wave energy. The acoustical wave energy generated by the vibrating unsupported end is directed to the passive radiator to move the passive radiator in response to both positive and negative pressures. It may be seen that the aforesaid system operates as a passive sound reflective intensifier.

Other features, advantages, and objects of the present invention will become apparent with reference to the following description and accompanying drawings.

BEST MODE FOR CARRYING OUT THE INVENTION

Figure 1:
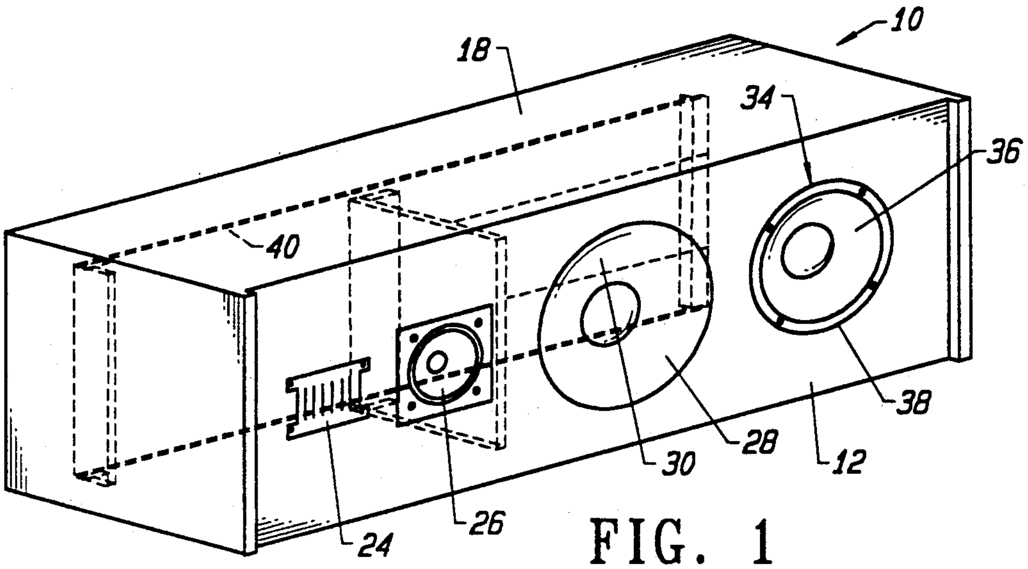
FIG. 1 is a frontal, perspective view of apparatus including a loudspeaker cabinet constructed in accordance with the teachings of the present invention.

Referring now to the drawings, apparatus constructed in accordance with the teachings of the present invention includes a cabinet 10 having a front wall 12, a rear wall 14 and opposed side walls 16, 18 interconnected thereto. Along with end walls 20, 22, the front, rear and side walls define an interior.

Mounted on the cabinet 10 at the front wall are a plurality of speakers, including a tweeter 24, a mid-range loudspeaker 26, and bass loudspeaker or woofer 28. The speakers 24, 26, 26 are of conventional construction. With respect to bass loudspeaker 28, such speaker has, as is conventional, a movable speaker element in the form of a cone 30 for directing acoustical wave energy to the ambient atmosphere and to the cabinet interior.

A passive radiator 34 is also mounted on the cabinet 10 at a location spaced from bass loudspeaker 28. The passive radiator is located at the front wall 12 of the cabinet. In the form illustrated, the passive radiator is in the form of a conventional speaker cone 36 movably connected to and disposed within a speaker housing or cage 38. The passive radiator differs from a complete loudspeaker in that there is no driver in operative association with the cone.

Affixed to end wall 20 by any desired expedient, such as screws, and extending therefrom within the interior of the cabinet is an elongated panel 40 which is constructed of any suitable high density material such as Masonite material or the like. Except where it is affixed to cabinet 10 at end wall 20, the panel 40 is unsupported and does not engage any other portion of the cabinet. Thus, the end 42 is a free end capable of movement relative to the cabinet. It is important that the panel 40 has a coarse surface 44 which faces the front wall of the cabinet. The opposed side of the panel, i.e. the side facing the rear wall 14, is smooth.

It should be noted that two lines of cut are formed in the panel to define a plurality of panel segments 50, 52, 54. The lines of cut, and thus the panel segments 50, 52, 54, extend from the panel free end 42 and terminate between free end 42 and the end of the panel which is connected to cabinet end wall 20.

Resilient material in the form of silicone is attached to the panel segments at the panel free end on the smooth surface facing the rear wall of the cabinet. The silicon is designated by reference numeral 58.

A baffle plate 62 projects from cabinet front wall 12 and terminates at a location spaced from panel 40. The baffle plate 62 extends between side walls 16, 18 and divides the cabinet interior into a first cabinet interior portion 64 and a second cabinet interior portion 66. In essence, baffle plate 62 defines a gap with rear wall 14 and the elongated panel 40 extends through the gap.

Figure 2:
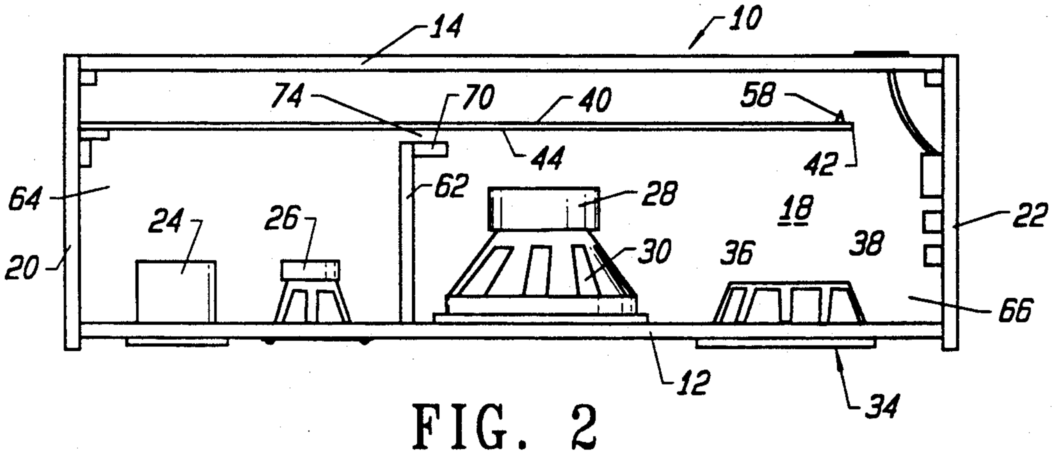
FIG. 2 is a side view of the interior of the apparatus wherein one of the side walls of the cabinet thereof has been removed.
Figure 3:
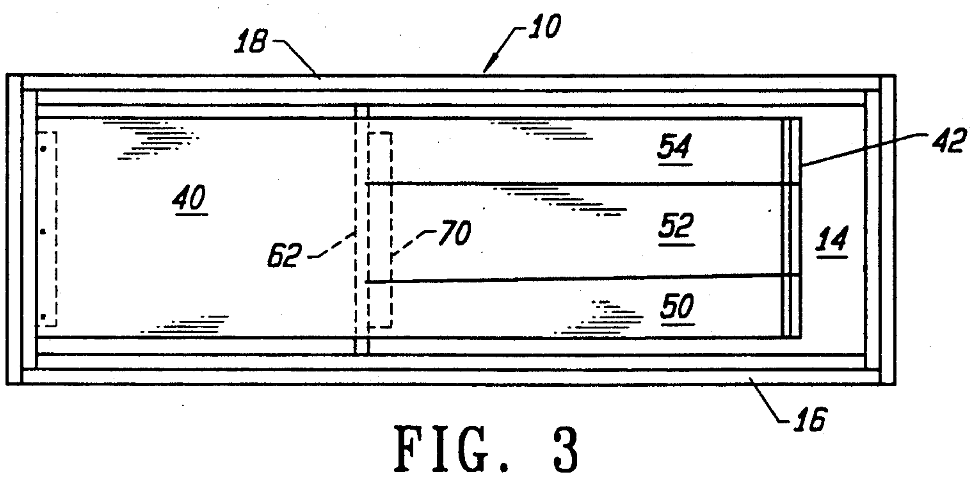
FIG. 3 is a plan view of selected portions of the apparatus including a panel which is so constructed as to function as the apparatus acoustic transfer means.
Figure 4:
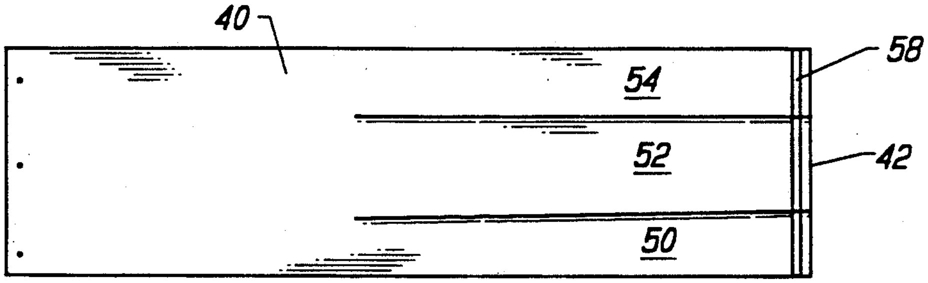
FIG. 4 is a plan view of the panel.
Figure 5:
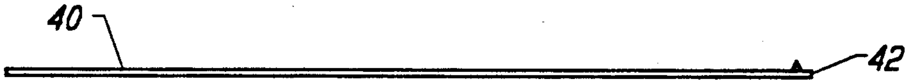
FIG. 5 is a side view of the panel.

Affixed to the distal end of baffle plate 62 and projecting at right angles thereto into second cabinet interior portion 66 is a bass block 70. Bass block 70 is located a distance from the panel 40 and cooperates with the panel to define a restricted passageway leading to the gap partially defined by the baffle plate 62 and extending between the first and second cabinet interior portions 64, 66. In FIG. 2 the passageway is designated by reference numeral 74.

In operation, the speakers 24, 26, 28 are driven in the usual fashion by an amplifier (not shown). As is conventional, the apparatus may include a crossover network for controlling actuation of the speakers. The panel 40 is impacted by the acoustical wave energy directed to the cabinet interior by the speakers.

Figure 8:
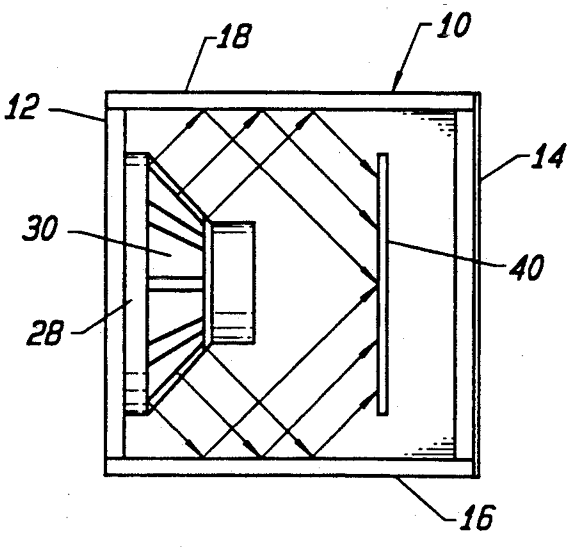
FIG. 8 is a diagrammatic view showing the relationship of the panel with a loudspeaker projecting into the cabinet interior.

FIG. 8 illustrates in schematic fashion the cooperative relationship between the bass loudspeaker or woofer 28 and the panel. As demonstrated by the arrows, it will be seen that the acoustical energy waves initially hit the side walls 16, 18 of the cabinet and then reflect onto the panel 40. If the loudspeaker 28 and the elongated panel 40 are positioned relative to each other and to the cabinet sides as shown in FIG. 8, the acoustical energy waves will impact the side walls at b 45 degrees and thus reflect at 45 degrees onto the panel. This is considered to be the maximal positioning of the apparatus elements when practicing the teachings of the present invention.

Still referring to FIG. 8, the acoustical energy waves being emitted from the widest point of the speaker cone 30 will be focused on and impact the center of panel 40, i.e. on panel segment 52. The acoustical wave energy from the mid-point of the cone will be focused on and impact essentially at the cuts defining the panel segments and thus will impact to some degree on all of the panel segments. Acoustical wave energy emitted from the cone 30 at or near its point of interconnection to the speaker driver will focus and impact upon panels 50, 54.

The acoustical wave energy which is focused on panel segment 52, i.e. the central panel segment, is a strong bass-reverb sound wave. The acoustical wave energy directed from the central segment of the cone 30 and focused between the central panel segment 52 and the outer panel segments 50, 54 is primarily bass-baritone. The acoustical wave energy emitted from the cone at or near the driver portion of the speaker and focused on the panel segments 50, 54 is a relatively weak vibration wave of tremolo-bass.

The panel segments independently vibrate under the impact of the acoustical wave energy emitted from bass loudspeaker 28 and the panel segments may be tuned to the harmonics of the bass loudspeaker by changing their widths. This will, of course, depend upon the precise sound characteristics of the loudspeaker to which they are tuned. In the case of a 10-inch woofer of the configuration shown in FIG. 8 which employs cone walls diverging at or about 45 degrees, desirable results were attained by cutting a $\frac{1}{8}$ inch thick Masonite panel so that panel segment 54 was three inches across throughout the 20-inch length thereof. The line of cut separating panel segments 50, 52, on the other hand, was angled so that the central panel segment 52 has a greater cross dimension where the lines of cut terminate than at the free end thereof and wherein the panel segment 50 is wider at the free end thereof than at the termination point of the line of cut defining same. More particularly, for a line of cut length of twenty inches, the panel segment 52 is four inches across at its free end and $4\frac{1}{2}$ inches across at the interior ends of the lines of cut defining same. Panel segment 50 has a three-inch width at its free end and converges to $2\frac{1}{2}$ inches.

The acoustical wave energy emitted by bass loudspeaker 28 and impacting upon the panel 40 will cause the panel segments 50, 52, 54 to flap or vibrate at different rates of speed. That is, the panel segments will accommodate and respond to different pitches emitted by the loudspeaker 28. In turn, the free ends of the panel segments will vibrate or flap at an amplitude exceeding the remainder of that particular panel segment.

It is to be noted that the panel segments 50, 52, 54 are in at least partial registration with passive radiator 34. Thus, sound waves or acoustical wave energy developed by the panel segments will impact cone 36 of the passive radiator and cause it to move in response to such impact. Such movement takes place in response to both positive and negative pressure so that the cone vibrates as a function thereof, with positive pressure moving the cone outwardly and negative pressure pulling the cone inwardly. This will be discerned by a listener as an increase in magnitude of the bass developed by the speaker system as well as an enhancement of the quality of such sound. The bass is full spectrum and not clipped or attenuated.

As indicated above, the surface of panel 40 facing toward the front of the cabinet is rough or coarse. This has been found to improve and make more efficient the operation of the apparatus.

Figure 6:
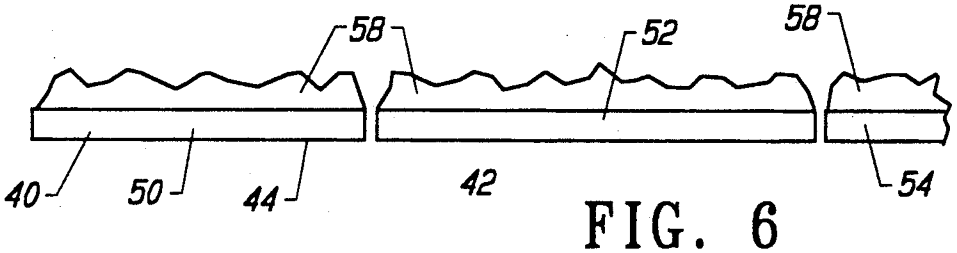
FIG. 6 is an enlarged, partial, frontal view of the panel free end.
Figure 7:
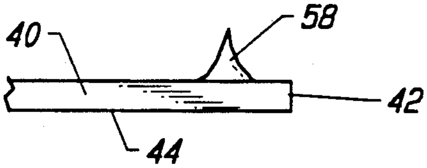
FIG. 7 is an enlarged, partial, side view of the panel free end.

The strip of silicone 58 applied to the panel segments preferably forms a generally saw-toothed pattern as shown in FIG. 6. The silicone strip serves a two-fold function. First, it provides additional weight at the free ends of the panel segments to enhance the "pendulum" effect, that is, increase the amplitude of the free ends. In addition, the "peaked" silicone will act as a shock absorber in the event sound energy becomes so great as to cause the free end of the panel to impact the rear-cabinet wall.

The purpose of the bass block 70 is to prevent bass acoustical wave energy from passing from the second cabinet interior portion 66 into the first cabinet interior portion 64 and thus interfere with proper operation of the apparatus.

It will be seen from the above that the panel 40 vibrates and whips responsive to sound stimuli, with the three panel segments 50, 52, 54 changing the volume inside cabinet 10 within the second cabinet interior portion 66. Such action will alternately compress or apply a vacuum to the cone 36 of the passive radiator. The entire cone of the passive radiator will vibrate accordingly, in effect converting the passive radiator into an active driver to enhance and improve the sound characteristics of the loudspeaker system.

I claim:

1. Apparatus comprising, in combination:

a cabinet having interconnecting walls defining an interior;

at least one loudspeaker mounted on said cabinet including a movable speaker element for directing acoustical wave energy to the ambient atmosphere and to said cabinet interior;

passive radiator means mounted on said cabinet at a location spaced from said at least one loudspeaker; and acoustic energy transfer means disposed within said cabinet housing and positioned relative to said at least one loudspeaker for impact by acoustical wave energy directed to the cabinet interior by said movable speaker element, said acoustic energy transfer means moving in response to said impact and operable to direct acoustical wave energy to said passive radiator means to move said passive radiator means, said acoustic energy transfer means comprising an elongated member having a substantially planar surface impacted by acoustical wave energy from said movable speaker element, said elongated member vibrating under the impact of acoustical wave energy from said movable speaker element and having a free distal end vibrating at an amplitude exceeding the amplitude of vibration of the remainder of said elongated member, said passive radiator means being in at least partial registration with said elongated member whereby acoustical wave energy is directed to said pressure radiator means by said elongated member.

2. The apparatus according to claim 1 wherein said elongated member comprises a panel having a plurality of panel segments, said panel segments being relatively movable and having free ends for vibrating at independent rates of vibration responsive to impact of acoustical wave energy from said movable speaker element.

3. The apparatus according to claim 1 wherein said substantially planar surface is a rough surface.

4. The apparatus according to claim 1 wherein said passive radiator means is a speaker diaphragm disposed in an opening formed in said cabinet.

5. The apparatus according to claim 2 wherein said panel has opposed ends, one of said opposed ends comprising said panel free distal end and the other of said opposed ends being attached to said cabinet, said panel being located between opposed walls of said cabinet and said panel segments being defined by lines of cut extending from said panel free distal end and terminating between said opposed ends.

6. The apparatus according to claim 2 additionally comprising resilient material affixed to said panel segment free ends.

7. The apparatus according to claim 6 wherein said resilient material is silicone attached to said panel segments on a surface opposed to said substantially planar surface.

8. The apparatus according to claim 7 wherein said surface to which said silicone is attached is a substantially smooth surface.

9. The apparatus according to claim 1 additionally comprising a baffle plate extending between walls of said cabinet and dividing said cabinet interior into first and second cabinet interior portions, said baffle plate defining a gap with one of the cabinet walls and said elongated member extending through said gap.

10. The apparatus according to claim 9 additionally comprising bass block means connected to said baffle plate and projecting therefrom at said gap, said bass block means being located a predetermined distance from said elongated member and cooperable with said elongated member to define a restricted passageway leading to said gap and extending between said first and second cabinet interior portions.

11. The apparatus according to claim 1 wherein said cabinet walls include a front wall, opposed side walls and a rear wall and wherein said loudspeaker includes a loudspeaker diaphragm in the form of a cone, said cone projecting inwardly from said cabinet front wall with the surface of said cone defining an angle of generally 45 degrees with said side walls, said substantially planar surface of said elongated member being so positioned relative to said side walls that acoustic energy waves from said movable speaker element reflected by said side walls impact said substantially planar surface at an angle of generally 45 degrees.

12. A method of enhancing the sound characteristics of a speaker system including a cabinet defining an interior and a loudspeaker mounted on said cabinet, said method comprising the steps of:

positioning a passive radiator in a cabinet opening spaced from said loudspeaker;

positioning an elongated member having opposed ends and a substantially planar surface within said cabinet interior with said substantially planar surface spaced from said loudspeaker and said passive radiator;

supporting said elongated member at one of the ends thereof while maintaining the other end thereof unsupported and at a position adjacent to said passive radiator;

impacting said elongated member with acoustical wave energy from said loudspeaker to vibrate said elongated member at said unsupported end;

employing said vibrating unsupported end to generate acoustical wave energy; and directing the acoustical wave energy generated by said vibrating unsupported end toward said passive radiator to move said passive radiator.

13. The method according to claim 12 wherein the vibrations at said unsupported end exceed in amplitude the vibrations along the remainder of the elongated member.

* * * * *